United States Patent [19]
Sexton et al.

[11] Patent Number: 5,311,252
[45] Date of Patent: May 10, 1994

[54] METHOD OF PROXIMITY IMAGING PHOTOLITHOGRAPHIC STRUCTURES FOR INK JET PRINTERS

[75] Inventors: Richard W. Sexton; James E. Harrison, Jr., both of Dayton, Ohio

[73] Assignee: Eastman Kodak Company, Rochester, N.Y.

[21] Appl. No.: 891,343

[22] Filed: May 29, 1992

[51] Int. Cl.⁵ ............... G03B 27/28; G01D 15/16; G01D 15/18
[52] U.S. Cl. ............................. 355/125; 346/140 R
[58] Field of Search ............ 355/125, 77; 346/140 R, 346/107 R

[56] References Cited

U.S. PATENT DOCUMENTS

| | | | |
|---|---|---|---|
| 4,184,925 | 1/1980 | Kenworthy | 204/11 |
| 4,223,321 | 9/1980 | Kenworthy | 346/75 |
| 5,016,024 | 5/1991 | Lam et al. | 346/140 R X |
| 5,096,535 | 3/1992 | Hawkins et al. | 156/633 |
| 5,111,220 | 5/1992 | Hadimioglu et al. | 346/140 R |
| 5,126,768 | 6/1992 | Nozawa et al. | 346/140 R |
| 5,149,419 | 9/1992 | Sexton et al. | 205/75 |
| 5,193,256 | 3/1993 | Ochiai et al. | 29/25.35 |

OTHER PUBLICATIONS

Commonly assigned U.S. Ser. No. 732,281.

*Primary Examiner*—Richard A. Wintercorn
*Attorney, Agent, or Firm*—Milton S. Sales

[57] ABSTRACT

A method of proximity imaging photolithographic structures for the fabrication of high resolution ink jet orifice plates is used in ink jet printers. The method comprises the step of providing a positive-acting photoresist coating onto an electrically conducting plating substrate. A clear glass photomask is brought into planar proximity and a planar gap is established by means of screen shims permanently bonded to the glass photomask. It is desirable to ensure that the shims are uniformly distributed about the mask with at least one shim in the center. An atmospheric pressure sufficient to ensure that the shims are settled against the resist-coated substrate is then applied, before exposing the surface with an ultraviolet light source and developing to produce a non-conductive peg pattern corresponding to the desired orifice pattern.

19 Claims, 1 Drawing Sheet

METHOD OF PROXIMITY IMAGING PHOTOLITHOGRAPHIC STRUCTURES FOR INK JET PRINTERS

TECHNICAL FIELD

The present invention relates to continuous ink jet printers and, more particularly, to proximity imaging for large orifice plates in ink jet printers.

BACKGROUND ART

Continuous ink jet printers comprise a series of electric and fluidic components, including an orifice plate and a charge plate, for generating one or more rows of jets of ink and selectively charging the ink droplets as they form from the jets. Typically, there may be several hundred jets formed in each row, and each jet may be stimulated to produce drops of ink at a given rate. All such drops fall through an electrical deflection field, and those which are charged are deflected into a catcher. Uncharged drops are deposited on a print media positioned below the print head.

One of the critical requirements in ink jet printers is an orifice plate which will produce several hundred jets of ink which are precisely positioned, precisely parallel, and precisely uniform in diameter and shape. The orifice plate must also be compatible with the ink compositions used, and must be resistant to erosion by the ink. In addition, the regions around the orifices should be sufficiently open to provide for cleaning ink and dirt deposits from the orifices for maintaining proper operation.

One method for producing an orifice plate which will produce several hundred jets of ink is described in U.S. Pat. No. 4,184,925. In the '925 patent, the orifice plate is formed of nickel metal, which is resistant to erosion. A photoresist is exposed through suitable masks and developed to produce round photoresist peg areas on each side of the substrate corresponding to the orifices which are to be formed. The orifice plate material, e.g. nickel, is then plated onto the substrate until the orifice material has grown up beyond the height of the pegs. The orifice material then begins to plate inwardly over the edges of the pegs until orifices of the desired size are formed.

Unfortunately, these prior methods placed the photomask in contact with the photo-resist-coated substrate. Dimpled or wavy areas in the substrate or lack of true parallelism caused overexposure, resulting in lack of homogeneity in image shape and dimensions. An additional disadvantage of contact exposure is the sticking and transfer of photoresist particles to the photomask with each exposure, which necessitates frequent cleaning, resulting in premature mask wear. For instance, in formation of resist dots or pegs by the contact exposure method for ink jet orifices, the range of peg diameters typically exceeded two microns variation, whereas the range of dot diameters of the photomask original was only 0.5 microns.

Imaging of photoresist coatings has been done by contacting the surface of coated substrates with a glass mask and exposing with ultraviolet light. For this procedure to yield images having the true dimensions of the photomask, the parts and all the supporting fixtures must be extremely flat in order to avoid shadowing effects where the mask does not locally conform to the substrate. Waviness in the substrate, or bowing, can produce localities where there is not complete contact over large areas.

For imaging that is not highly critical, and to overcome mask sticking, proximity exposure equipment can be used wherein various mechanical schemes are used to establish a planar gap between the substrate and photomask. However, available mask aligner exposure units could not provide satisfactory and reproducible results with the minimum exposure distance being about 0.001 inch. Flat solid foil shims of about 0.0005 inch thickness could be inserted around the mask periphery, but these were impractical to handle because of their fragility.

It is seen then that there is a need for a straightforward method for ensuring close and precise space maintenance between the substrate and the photomask.

SUMMARY OF THE INVENTION

This need is met by the method according to the present invention, wherein very thin screen standoffs are permanently bonded to the photomask. The adhesive bond squeezes into the apertures of the screen material, and the screen thickness determines the shim height, which is typically less than one mil. When solid shims were bonded permanently to the mask, the resultant standoff thickness was always greater than one mil, due to the additive thickness of the adhesive.

In accordance with one aspect of the present invention, a method of proximity imaging photolithographic structures for the fabrication of high resolution ink jet orifice plates comprises the step of: providing a positive-acting photoresist coating onto an electrically conducting plating substrate. A clear glass photomask is then brought into planar proximity and a planar gap is established by means of screen shims permanently bonded to the glass photomask. The method further comprises the step of ensuring that the shims are uniformly distributed about the mask with at least one shim in the center. An atmospheric pressure sufficient to ensure that the shims are settled against the resist-coated substrate is applied. Finally, the method comprises the step of exposing the surface with an ultraviolet light source and developing to produce a non-conductive peg pattern corresponding to the desired orifice pattern.

Accordingly, it is an object of the present invention to use screen shims to ensure close and precise space maintenance over the whole area between the substrate and the photomask. Another object of the present invention is to use photoresist pegs formed therefrom to make orifice plates for a high-resolution ink jet printer. Other objects and advantages of the invention will be apparent from the following description, the accompanying drawings and the appended claims.

DETAILED DESCRIPTION OF THE PREFERRED EMBODIMENTS

A primary source of variation in photoresist peg diameters has been the lack of uniform gap between the photomask and the photoresist-coated substrate, because these components are not perfectly flat. The resist material used is preferably a positive-acting resist spin coated to a thickness of about two microns. The preferred substrate is a brass sheet machined with a single point diamond tool to an optically smooth mirror finish.

Figure 1:
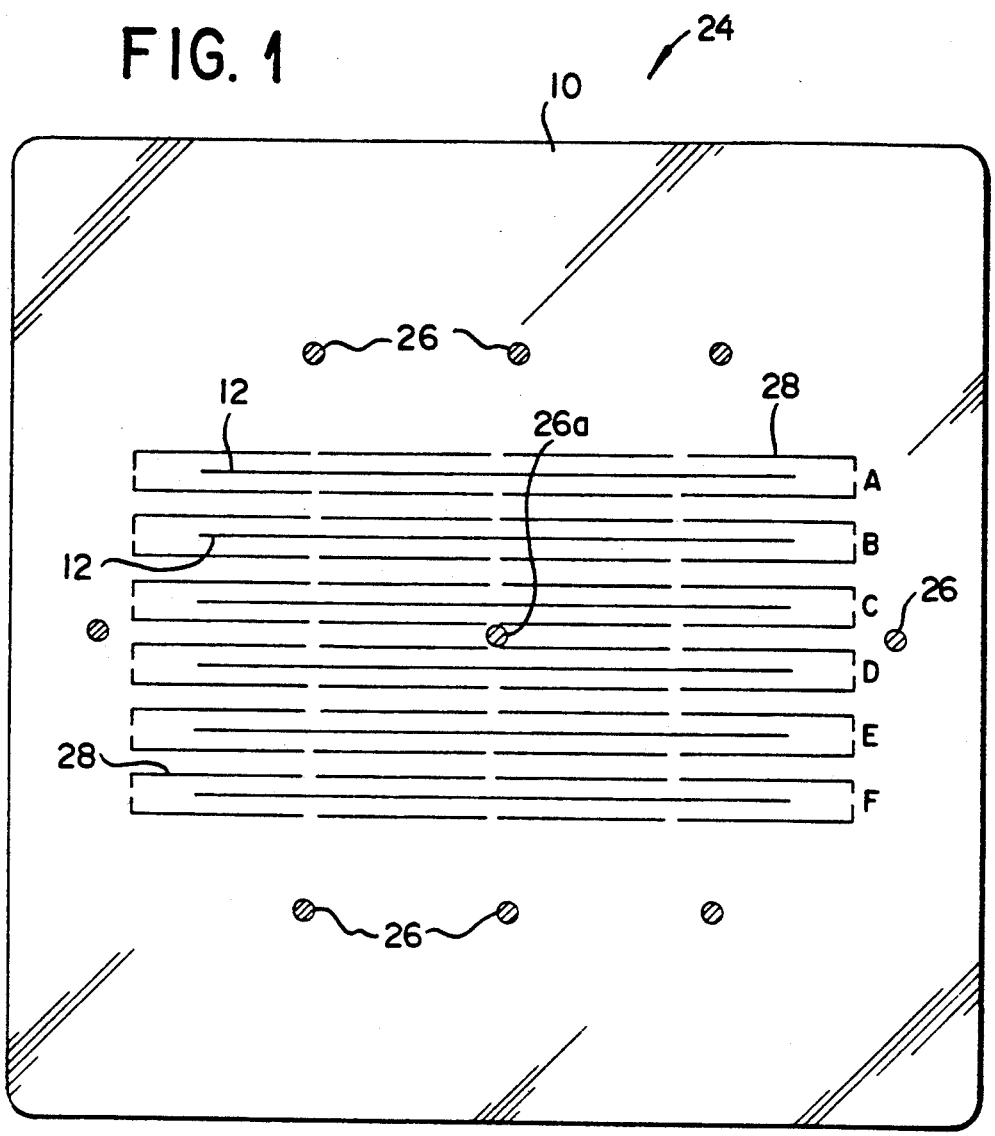
FIG. 1 is a magnified cross sectional view of a glass photomask and an orifice plate substrate showing the effect of non-uniform gap distance on resultant peg geometry.

Referring now to FIG. 1, a magnified schematic representation of the cross section of a photomask 10, preferably glass, and substrate 14 showing variation in peg geometry resulting from gap variation is illustrated. The glass photomask 10 usually has thereon a plurality of round, opaque chromium spots 12 that are used to image the orifice array pattern on the flat electrically conductive substrate 14, such as brass, which has been coated with a photoresist. Ultraviolet light source 16 is shed onto and through the glass photomask in order to image the corresponding non-conductive resist pegs 18 and 20.

Figure 2:
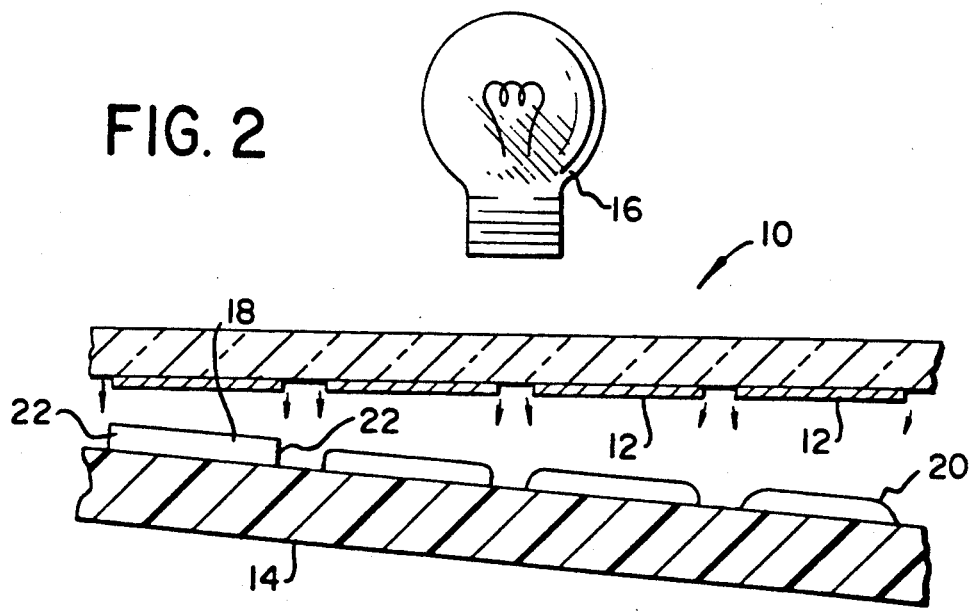
FIG. 2 is an illustration of a typical orifice plate photomask showing the location of bonded screen shims.

Continuing with FIG. 2, there is illustrated the typical result when parallelism is not maintained during the exposure. As illustrated, the peg 18 formed at a close distance is larger and has straighter walls 22 than peg 20. Peg 20 has been formed at a greater distance from the mask 10, resulting in non-uniformity in the peg diameters. An additional disadvantage of contact exposure results from sticking of the mask 10 to the resist at random contact points, and transfer of resist to the glass mask 10 with each use.

In FIG. 1 an assembly 24 illustrating the size and placement of screen shims 26 on the face of the square glass mask 10 is shown. Placement of the shims 26 around the perimeter of the mask 10 may not be especially critical, but the shim 26a at the center of the mask 10 is needed to prevent the mask 10 from bowing when about 1 psi of atmospheric pressure is applied to the assembly 24 to hold the shims 24 in close contact during ultraviolet exposure.

More specifically, FIG. 1 shows a full scale front view of the assembly 24, wherein the glass photomask 10 has several arrays of chromium spots 12, each having a surrounding border 28. The chromium dots 12 and corresponding borders 28 form six discrete orifice plate patterns having more than 1000 spots 12 each and each being more than four inches in length. In the embodiment described by FIG. 2, there are shown a total of nine screen shims 26 bonded to the glass mask 10 to provide uniform distribution of an exposure gap when the shims 26 are placed in contact with a resist coated substrate 14.

The use of thin screen standoffs is beneficial in providing improved resolution and mask life for orifice plate fabrication. For example, in a specific instance, an array of 1032 orifices on 1-over-240 centers, or 0.00417 inches, is used for high resolution ink jet printing. For optimum drop-size uniformity and resultant print quality, the orifice size must be about 1.4 mil diameter and the range in diameters across the array should be 2 microns or less. The orifices are made by overplating a nonconductive round dot or peg which is about 3.5 mils in diameter.

As will be understood by those skilled in the art, in the art of screen printing uniform thicknesses of coatings and adhesives are normally applied by means of a wire screen of a specified mesh size and thickness. The quantity of adhesive material is determined by the screen thickness and the screen is used to distribute the adhesive uniformly on the desired surface. Typically, industrial wire screens are woven from finely drawn wire, and for thin film applications, very fine electroformed screens of 500 mesh or greater are sometimes used.

To form a thin, permanently bonded standoff on the glass mask for proximity exposure, pieces of 1000 mesh screen were placed on the glass and the mesh was filled with adhesive. The adhesive and screen were pressed between the glass mask and a block of TEFLON ™ so that any excess would maintain the thickness of the screen shim. After the adhesive cured, the Teflon block was removed. Excess adhesive can then be trimmed from the glass by any suitable means, including a razor blade. The adhesive, then, just fills the open mesh with the thickness of the adhesive being determined by the screen thickness, a typical thickness being 0.0005 inch. The screen material is left permanently bonded after curing of the adhesive.

The use of thin screen standoffs is beneficial in providing improved resolution and mask life for orifice plate fabrication. For example, in a specific instance, an array of 1032 orifices on 1-over-240 centers, or 0.00417 inches, is used for high resolution ink jet printing. For optimum drop-size uniformity and resultant print quality, the orifice size must be about 1.4 mil diameter and the range in diameters across the array should be 2 microns or less. The orifices are made by overplating a nonconductive round dot or peg which is about 3.5 mils in diameter. The desired specification can be consistently achieved with proximity of less than one mil. Variability is greater than 2 microns when vacuum contact exposure is used.

Industrial Applicability and Advantages

The present invention is useful in the field of ink jet printing, and has the advantage of providing precise images for orifice plate fabrication. Fabrication results using the thin shims have shown two advantages over contact exposure. First, the number of useful exposures with the mask has exceeded the old method by a factor of two. Second, use of the present invention resulted in the unexpected advantage of providing improvement in diameter ranges over the array when all the images were held away from the substrate in proximity exposure. There is an exposure-leveling effect with the present invention, whereas in contact exposure, in localities where the mask is truly in hard contact, the images vary substantially in size and side wall straightness.

The invention has been described in detail wit particular reference to certain preferred embodiments thereof, but it will be understood that modifications and variations can be effected within the spirit and scope of the invention.

We claim:

1. A method of proximity imaging photolithographic structures for the fabrication of high resolution ink jet orifice plates comprising the steps of:
   a. providing a positive-acting photoresist coating onto an electrically conducting plating substrate;
   b. bringing a clear glass photomask into planar proximity;
   c. establishing a planar gap by means of screen shims permanently bonded to the glass photomask;
   d. uniformly distributing the screen shims about the mask;
   e. applying an atmospheric pressure sufficient to ensure that the shims are settled against the resist-coated substrate to create a structure; and
   f. exposing a surface of the structure and developing the exposed surface to produce an imaged array.

2. A method as claimed in claim 1 wherein the step of uniformly distributing the screen shims comprises the step of placing at least one screen shim in the center of the glass photomask.

3. A method as claimed in claim 1 wherein the step of exposing the surface comprises the step of exposing with an ultraviolet light source.

4. A method as claimed in claim 1 wherein the imaged array comprises a non-conductive peg pattern corresponding to the desired orifice pattern.

5. A method as claimed in claim 1 further comprising the step of forming long imaged arrays having more than 1000 openings.

6. A method as claimed in claim 5 wherein the range in diameters across the imaged array is 2 microns.

7. A method as claimed in claim 5 wherein the range in diameters across the imaged array is 2 microns.

8. A method as claimed in claim 1 further comprising the step of overplating the imaged arrays with an overplating material to form ink jet orifices.

9. A method as claimed in claim 8 wherein the overplating material is nickel.

10. A proximity imaging photolithographic structure for the fabrication of high resolution ink jet orifice plates comprising:
   a. an electrically conducting plating substrate;
   b. a positive-acting photoresist coating for coating onto the electrically conducting plating substrate;
   c. a clear glass photomask in planar proximity to the coated substrate;
   d. screen shims permanently bonded to the glass photomask for establishing a planar gap;
   e. means for applying an atmospheric pressure sufficient to ensure that the shims are settled against the resist-coated substrate to create a structure;
   f. means for exposing a surface of the structure; and
   g. means for developing the exposed surface to produce an imaged array.

11. A structure as claimed in claim 10 wherein the screen shims are uniformly distributed on the glass photomask.

12. A structure as claimed in claim 11 wherein at least one screen shim is placed in the center of the glass photomask.

13. A structure as claimed in claim 10 wherein the means for exposing the surface comprises an ultraviolet light source.

14. A structure as claimed in claim 10 wherein the imaged array comprises a non-conductive peg pattern corresponding to the desired orifice pattern.

15. A structure as claimed in claim 10 wherein long imaged arrays have more than 1000 openings.

16. A structure as claimed in claim 15 wherein the range in diameters across the imaged array is 2 microns.

17. A structure as claimed in claim 15 wherein the range in diameters across the imaged array is 2 microns.

18. A structure as claimed in claim 10 wherein the imaged arrays are overplated with an overplating material to form ink jet orifices.

19. A structure as claimed in claim 18 wherein the overplating material is nickel.

* * * * *